United States Patent [19]

Yamazaki et al.

[11] Patent Number: 5,641,380

[45] Date of Patent: Jun. 24, 1997

[54] METHOD FOR FABRICATING A SEMICONDUCTOR DEVICE

[75] Inventors: Shunpei Yamazaki, Tokyo; Hideomi Suzawa; Yasuhiko Takemura, both of Kanagawa, all of Japan

[73] Assignee: Semiconductor Energy Laboratory Co., Ltd., Kanagawa, Japan

[21] Appl. No.: 566,175

[22] Filed: Dec. 1, 1995

[30] Foreign Application Priority Data

Dec. 12, 1994 [JP] Japan ................................. 6-332070

[51] Int. Cl.$^6$ ................................................ H01L 21/00
[52] U.S. Cl. ......................... 438/304; 438/705; 438/696; 438/486
[58] Field of Search ..................... 156/628.1, 643.1, 156/657.1, 659.1; 216/62, 87; 437/20, 40, 225, 180

[56] References Cited

U.S. PATENT DOCUMENTS

| | | | |
|---|---|---|---|
| 4,601,778 | 7/1986 | Robb | 156/628.1 |
| 4,897,150 | 1/1990 | Dooley et al. | 156/628.1 |
| 4,960,675 | 10/1990 | Tsuo et al. | 156/628.1 X |
| 5,147,826 | 9/1992 | Liu et al. | |
| 5,275,851 | 1/1994 | Fonash et al. | |

OTHER PUBLICATIONS

G. Liu et al., "Polycrystalline silicon thin film transistors on Corning 7059 glass substrates using short time, low-temperature processing," *App. Phys. Lett.* 62(20), May 17, 1993, pp. 2554–2556.

G. Liu et al., "Selective area crystallization of amorphous silicon films by low-temperature rapid thermal annealing," *Appl. Phys. Lett.* 55(7), Aug. 14, 1989, pp. 660–662.

*Primary Examiner*—William Powell
*Attorney, Agent, or Firm*—Sixbey, Friedman, Ledom & Ferguson, P.C.; Gerald J. Ferguson, Jr.

[57] ABSTRACT

There is proposed a process for performing (quasi-) anisotropic etching on a silicon-based material without using plasma. The process consists of irradiating a polycrystalline or single-crystalline silicon film or substrate with a beam of accelerated hydrogen ions, silicon ions, or rare gas ions, so that the crystalline silicon is made amorphous. Then, the amorphous silicon is placed in an atmosphere of fluorinated halogen. Since the etching rate of fluorinated halogen for amorphous silicon is greater than that for polycrystalline or single-crystalline silicon, etching takes place selectively at the area which has been irradiated with a beam of accelerated hydrogen ions, silicon ions, or rare gas ions. The selective etching permits (quasi-) anisotropic etching instead of sideward isotropic etching.

20 Claims, 4 Drawing Sheets 5,641,380

1

METHOD FOR FABRICATING A SEMICONDUCTOR DEVICE

BACKGROUND OF THE INVENTION

1. Field of the Invention:

The present invention relates to a method for fabricating a semiconductor device and, more particularly, to a method for (quasi-)anisotropic etching of silicon-based material in single- or poly-crystalline form. The etching process according to the present invention employs substantially no plasma.

2. Description of the Related Art:

The demand for finer patterns of semiconductor integrated circuits has led to the development of a variety of dry etching processes. The fabrication of finer patterns with a high aspect ratio (width-to-height ratio) needs the technique of anisotropic etching (that takes place selectively in the vertical direction). The anisotropic etching is used for microfabrication of silicon-based material such as semiconductor substrate, gate electrode, and interconnect.

Conventional anisotropic etching employs plasma which ionizes a fluoride gas such as $CF_4$ and $SF_6$, thereby generating active fluorine species which react with silicon to give volatile silicon fluoride. A disadvantage of this conventional process is the possibility of carbon or sulfur in the etching gas combining with silicon and entering the semiconductor element during etching. Another disadvantage is that the etching gas deposits a teflon-like polymer on the inner wall of the chamber after etching for a long period of time. In addition, plasma for etching causes damage to semiconductors, presenting a problem with reliability.

The conventional process for etching silicon-based material employs fluorinated halogen as an etching gas, which is a substance represented by the formula $XF_n$ (wherein X is a halogen other than fluorine, and n is an integer), such as ClF, $ClF_3$, BrF, $BrF_3$, IF, and $IF_3$. These substances have such a strong fluorinating action that they perform etching (gas etching) without requiring active species generated by plasma. Gas etching, like wet etching, advances in the lateral direction as well as in the vertical direction. In other words, it does not perform anisotropic etching which advances only in the vertical direction.

SUMMARY OF THE INVENTION

The present invention was completed to address the above-mentioned problem. It is an object of the present invention to provide a process of performing (quasi-) anisotropic etching using substantially no plasma but using a fluorinated halogen as an etching gas. The process offers the advantage that silicon semiconductors are not contaminated with foreign elements such as carbon and sulfur and that the maintenance of the etching chamber is easy. In addition, the process does not cause plasma-induced damage to semiconductor elements and this contributes to improved reliability.

2

Figure 4A:
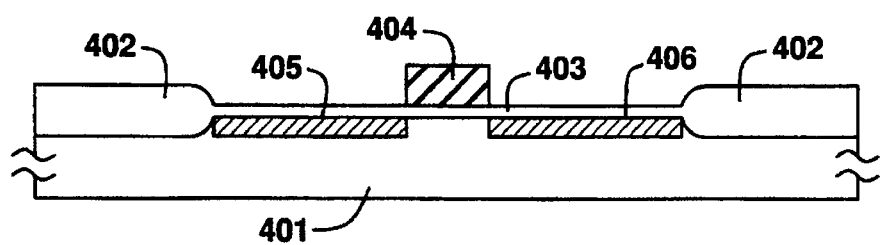
Figure 4B:
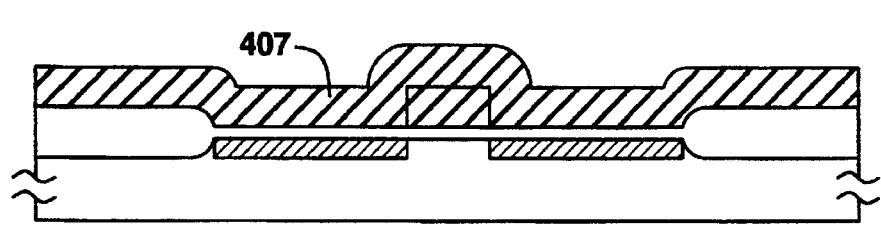
Figure 4C:
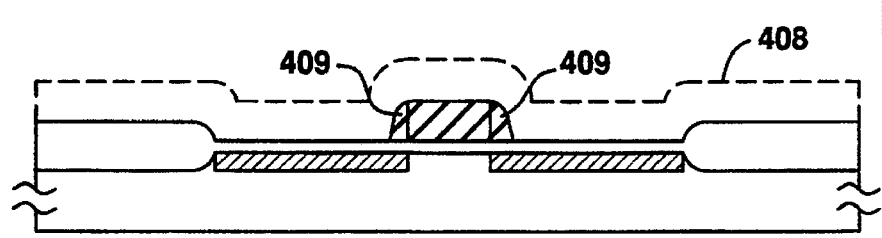
Figure 4D:
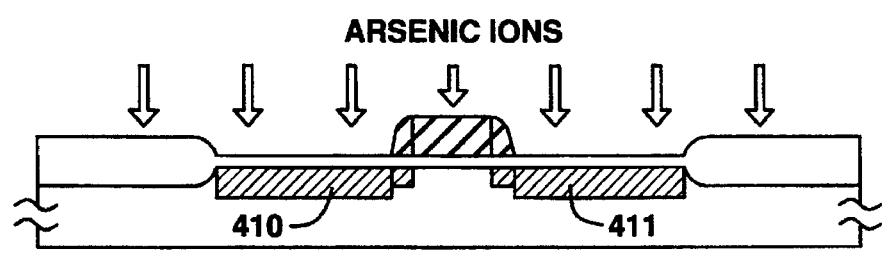
Figure 4E:
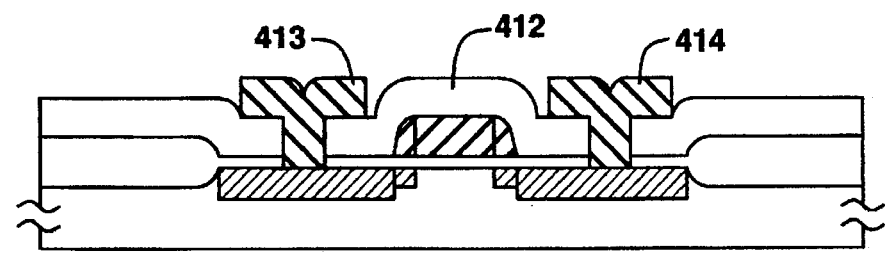

FIG. 4(A) (B) (C) (D) and (E) is a schematic diagram illustrating the fabrication of GOLD type transistor in the example.

Figure 5A:
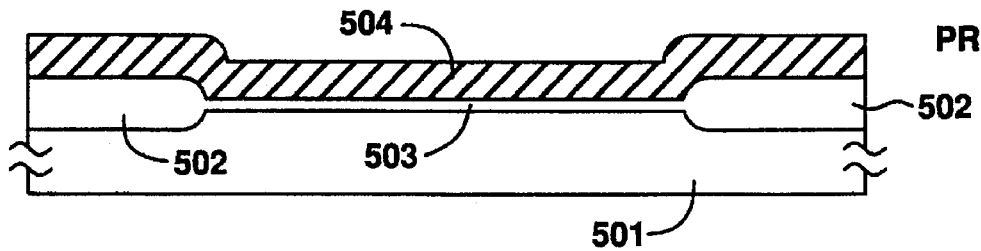
Figure 5B:
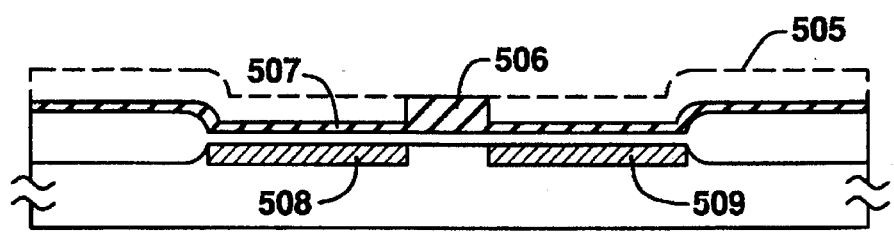
Figure 5C:
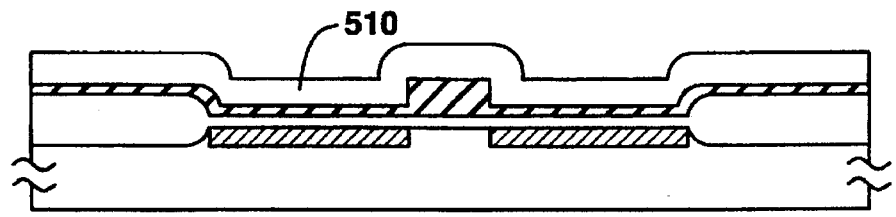
Figure 5D:
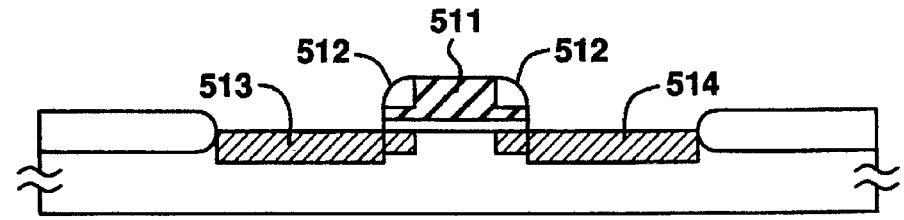
Figure 5E:
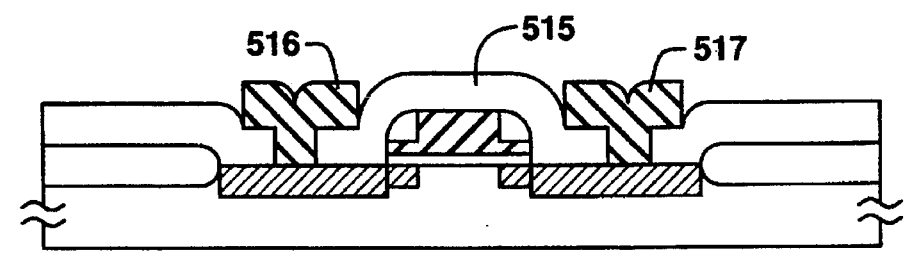

FIG. 5(A) (B) (C) (D) and (E) is a schematic diagram illustrating the fabrication of IT-LDD type transistor according to the prior art technology.

DESCRIPTION OF THE PREFERRED EMBODIMENTS

The gist of the present invention resides in a process for anisotropic etching which comprises irradiating a crystalline silicon-based material with accelerated hydrogen ions, silicon ions, or rare gas ions in the approximately vertical direction, thereby selectively forming an amorphous part in said material, and placing said material in an atmosphere of fluorinated halogen, thereby performing etching preferentially on the amorphous part.

The silicon-based material is silicon film or silicon substrate in polycrystalline or single-crystalline form. The rare gas is helium or argon. The present inventors' investigation indicates that single-crystalline silicon is most resistant to etching with fluorinated halogen and polycrystalline silicon and amorphous silicon come next. Amorphous silicon is etched with $ClF_3$ about twice as fast as polycrystalline silicon.

The present invention is based on the principle that the etching rate varies depending on the state of crystal. In other words, the (quasi-) anisotropic etching becomes feasible if amorphus silicon is formed intentionally. The principle will be explained with reference to FIG. 1.

FIG. 1 shows a process for etching a crystalline silicon film 2 deposited on a substrate (1). The process starts with forming by any known photolithography a photoresist mask 3, with an opening formed therein which permits etching. (FIG. 1(A))

Figure 1A:
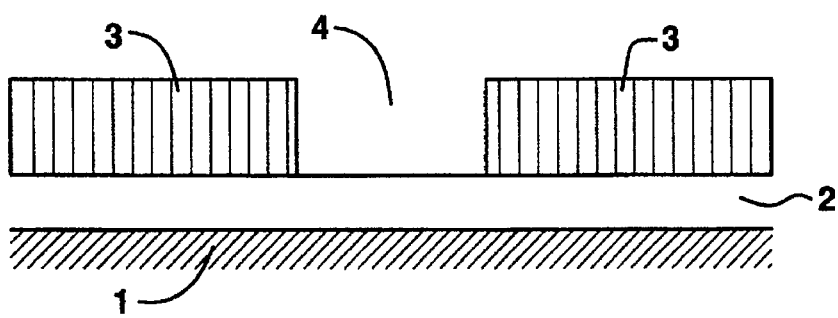
FIG. 1(A) (B) (C) (D) and (E) is a schematic diagram illustrating the mechanism of etching according to the present invention.
Figure 1B:
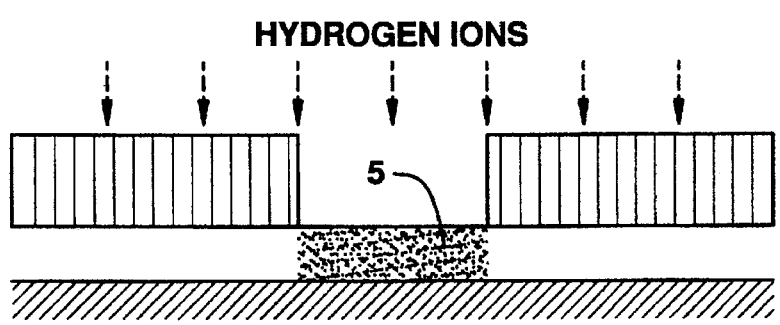
Figure 1C:
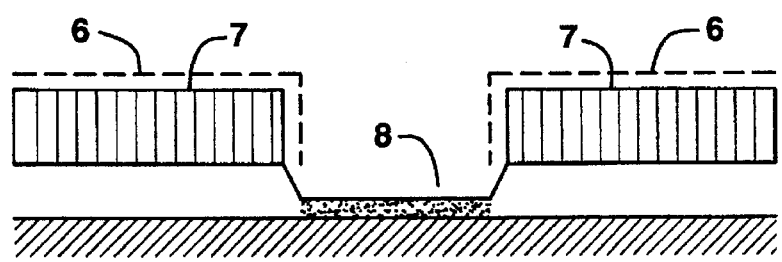

Then, the wafer is irradiated with a beam of accelerated hydrogen ions, silicon ions, or rare gas (argon, helium, etc.) ions, so that an amorphous region 5 is formed in the silicon region under the opening 4. In order to convert crystalline silicon into amorphous silicon efficiently, it is desirable to use ion species of greater mass, such as silicon, argon, xenon, and krypton. Hydrogen is inferior in this regard because of its smaller mass. Nevertheless, hydrogen is also desirable because silicon containing hydrogen in high concentrations (more than $1 \times 10^{21}$ atoms/cm$^3$) permits highly selective etching because hydrogen promotes reaction between fluorinated halogen and silicon. For silicon of specific use, it is also possible to use boron ions which, upon reaction with fluorinated halogen, forms a gaseous fluoride. Subsequently, the wafer is placed in an atmosphere of fluorinated halogen so that the silicon film and photoresist undergo etching. The rate of etching can be properly controlled according to the concentration, temperature, and flow rate of fluorinated halogen. FIG. 1(C) shows a wafer in the course of etching. The initial surface of the photoresist (indicated by a broken line 6) has now retreated to the line 7, and the amorphous region 5 under the opening 4 undergoes selective etching. At the same time, the film of crystalline silicon surrounding the amorphous silicon region also undergoes etching to a limited extent. In this way there is formed a hole 8 with its inner surface almost vertically etched.

Figure 1D:
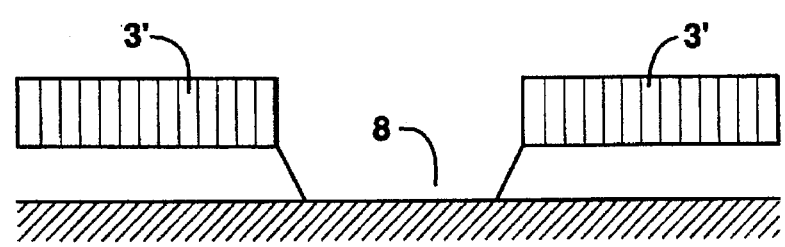

The etched wafer is shown in FIG. 1(D). It is noted that according to the present invention it is impossible to suppress the sideward etching completely. The consequence is quasian-isotropic etching. In order to suppress the sideward etching, it is necessary to increase the rate of etching in amorphous silicon much more than that in crystalline silicon. (FIG. 1(D))

Figure 1E:
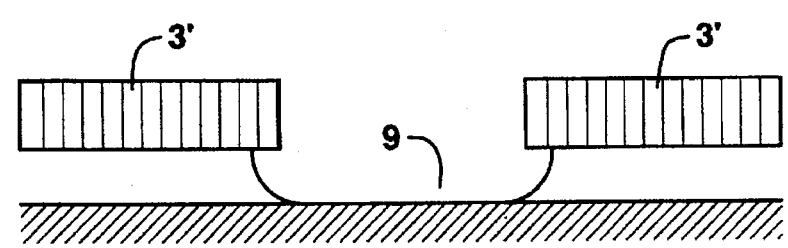

If mere etching with fluorinated halogen is carried out without resorting to the process of the present invention, the result will be isotropic etching which forms gently-sloping side walls, as shown in FIG. 1(E). (FIG. 1(E))

In the case of FIG. 1, the crystalline silicon film is made amorphous by selective ion bombardment through a photoresist mask. Alternatively, it is possible to selectively form an amorphous region by controlling the depth of ion penetration. This is illustrated in FIG. 2.

First, an interconnect 12 of crystalline silicon is formed on a substrate 11, and it is covered with a crystalline silicon film 13. (FIG. 2 (A))

Then, the wafer is irradiated with a beam of hydrogen ions, silicon ions, or rare gas ions, so that an amorphous region 14 is formed in the crystalline silicon film. The crystalline silicon interconnect 12 remains intact because the depth of ion penetration is properly controlled according to the ion accelerating voltage. It is desirable that the silicon film 13 be made amorphous entirely, and it is possible that the upper part of the silicon interconnect 12 is partly made amorphous. As far as the depth control is concerned, hydrogen ions with a small ionic radius are inferior to silicon ions, argon ions, krypton ions, and xenon ions with a large ionic radius. (FIG. 2(B))

Subsequently, the wafer is placed in an atmosphere of fluorinated halogen so that the silicon film undergoes etching. Etching starts at the surface and reaches the part which is not made amorphous. Since the amorphous part (formed by ions) is preferentially etched, the part which is not made amorphous remains intact as indicated by a triangle 17 adjacent to the silicon interconnect. The remainder of the amorphous part is etched to the level indicated by 16 in FIG. 2(C). The broken line 15 in FIG. 2(C) indicates the original silicon film. (FIG. 2 (C))

Figure 2A:
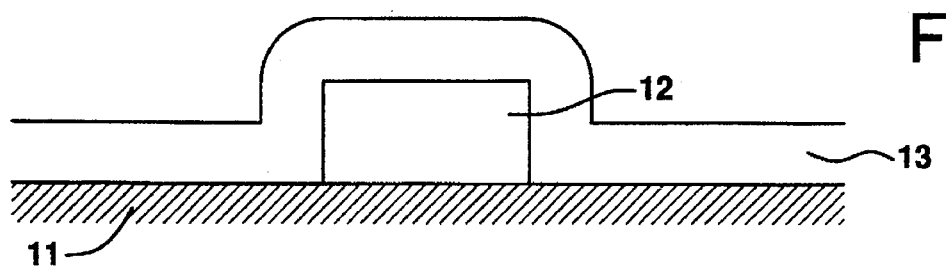
FIG. 2(A) (B) (C) and (D) is a schematic diagram illustrating the mechanism of etching according to the present invention.
Figure 2B:
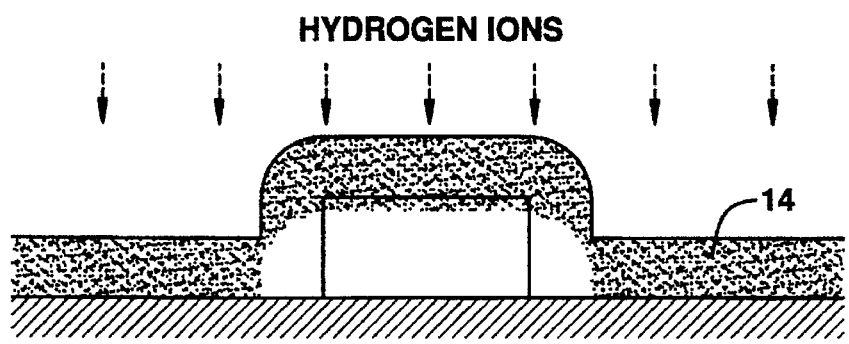
Figure 2C:
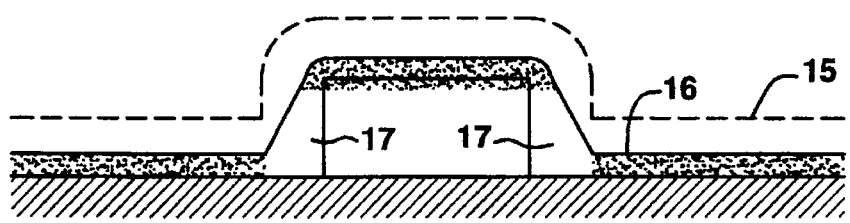
Figure 2D:
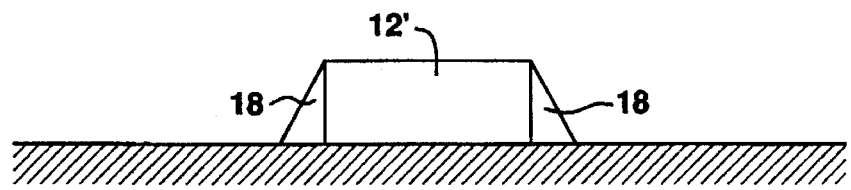

When etching is completed, the wafer looks as shown in FIG. 2(D). It is noted that an approximately triangular wall 18 of silicon is formed on each side of the silicon interconnect 12'. The top of the original silicon interconnect is slightly etched. These side walls are useful when semiconductor elements are formed, as demonstrated in the example that follows. (FIG. 2(D))

EXAMPLE

The present invention will be described in more detail with reference to FIG. 4 illustrating an example in which a new field-effect transistor is produced. The reduction in design rule of semiconductor integrated circuits suffers the disadvantage that injection of hot carriers takes place in the field-effect transistor due to the steep rise of electric field strength across the drain and channel. The deterioration of characteristic properties due to the reduction in design rule (or the shortening of channel length) is usually referred to as short channel effect. In order to suppress the short channel effect, there was developed a MIS-type field-effect transistor which has the lightly doped drain (LDD) 306 and 307, which is the region in which the concentration of impurity is low. (FIG. 3)

A device of this type has the LDD 306 and 307 (in which the concentration of impurity is lower than that in the source/drain) which is formed between the source 304 and the channel forming region or between the drain 305 and the channel forming region. This structure relieves the electric field and hence suppresses the generation of hot carriers.

Figure 3:
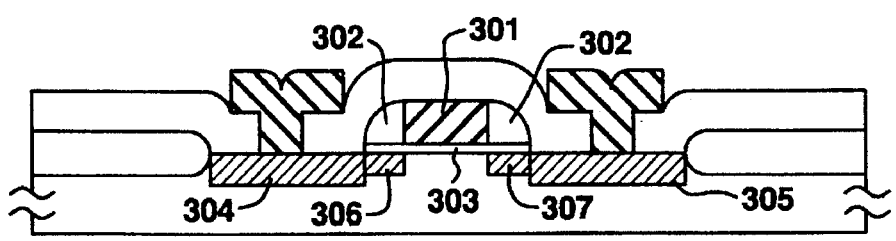
FIG. 3 is a schematic diagram illustrating the LDD structure fabricated by the prior art technology.

The LDD 306 and 307 as shown in FIG. 3 is formed in the following manner. First, the gate electrode 301 is formed. It is then doped so as to form a region in which the concentration of impurity is low. The side wall 302 is formed from silicon oxide or the like. Using the side wall as a mask, doping is carried out by the self-alignment technique so as to form the source/drain.

For this reason, the gate electrode 301 is not present on the LDD and hence hot carriers are trapped by the gate insulating film 303 on the LDD 307 and 308. Trapping of hot carriers (especially hot electrons) reverses the conductivity type of the LDD, changes the threshold value, increases the sub-threshold factor, and decreases the punchthrough voltage. All of such phenomena are due to the short channel effect.

In order to address this problem, there has been proposed the overlap LDD structure (GOLD structure) in which the gate electrode covers the top of LDD. This structure prevents the characteristic properties from deteriorating by hot carriers being trapped by the gate insulating film on LDD. However, it has been difficult to produce the GOLD structure.

A MIS-type field-effect transistor of GOLD structure has been reported by T. Y. Huang in IEDM Tech. Digest 742 (1986). Its fabricating process is schematically shown in FIG. 5.

First, the semiconductor substrate 501 is covered with a field insulator 502, a gate insulating film 503, and a conductive film 504 (of polycrystalline silicon or the like) formed on top of the other. (FIG. 5(A))

The conductive film 504 undergoes etching so that a gate electrode 506 is formed. What is important in this step is that the conductive film 504 is not entirely etched but a thin conductive film 507 (of adequate thickness of 100–1000 Å) remains. This etching step, therefore, involves extreme difficulties. (The original conductive film 504 is indicated by a broken line 505.)

The LDD 508, 509 is formed by through-doping through the thin conductive film 507 and the gate insulating film 503. Sufficient through-doping is infeasible if the conductive film 507 is thick. In addition, the amount of doping will fluctuate if the conductive film varies in thickness from one wafer to another or from one batch to another. (FIG. 5 (B))

Then, the entire surface of the wafer is covered with a film 510 of silicon oxide or the like. (FIG. 5(C))

The film 510 undergoes anisotropic etching in the same manner as the conventional LDD structure is formed, so that the side wall 512 is formed. This etching removes the conductive thin film 507, too, and forms the gate electrode 511. Using the thus formed side wall 512 as a mask, doping is performed by the self-alignment technique so as to form the source 513 and the drain 514. (FIG. 5(D))

Finally, the interlayer insulator 515, the source electrode/interconnect 516, and the drain electrode/interconnect 517 are formed, and the MIS-type field-effect transistor is completed. (FIG. 5(E))

As apparent from the figure, the gate electrode 511 takes on a shape of inverted T and hence it is called IT-LDD. The fact that the thin part of the gate electrode 511 is present on the LDD permits the carrier density on the LDD surface to be controlled to some extent by the gate electrode. The consequence is that even though the concentration of impurity in LDD is reduced, mutual conductance is hardly reduced by the serial resistance of LDD and the device properties are hardly changed by hot carriers injected into the insulating film on LDD.

These advantages are not inherent in the IT-LDD structure but are common to all the GOLD structures. The fact that it is possible to lower the concentration of impurity in LDD permits one to relieve the electric field. The fact that it is possible to reduce the depth of LDD permits one to eliminate the short-channel effect and suppress the punchthrough.

The only conventional effective method for producing GOLD has been by the IT-LDD structure. It is not practical in the conventional LDD structure to merely form the side wall from a silicon-based conductive film. The reason for this is that when the side wall is formed it is difficult to control etching such that etching stops at the gate insulating film composed mainly of silicon oxide. Etching actually reaches the substrate. This is because the conventional dry etching does not have a sufficiently high selectivity for silicon and silicon oxide and because the thickness of the gate insulating film is approximately one-tenth that of the gate electrode (side wall).

Despite the above-mentioned many advantages, the IT-LDD structure is extremely difficult to fabricate. It is particularly difficult to control the etching of the conductive film shown in FIG. 5(B). If the thickness of the thin conductive film 507 varies from one wafer to another or within a wafer, the concentration of impurity in the source/drain varies, with the result that the characteristic properties of the transistor varies.

According to the present invention, it is possible to make the side wall extremely simply from a silicon-based material (containing more than 95% silicon). In other words, if the side wall is made a part of the gate electrode, it is possible to obtain the GOLD structure. What is necessary to obtain this structure is to cover the central part of the gate electrode with a conductive film of silicon-based material and perform anisotropic etching on the film according to the present invention.

The etching to form the side wall in the present invention makes it possible to establish a sufficiently high selectivity for the side wall and the gate insulating film. This is due to the fact that fluorinated halide hardly etches silicon oxide. The result is unlikeliness of overetching on the substrate and gate insulating film.

In the example that follows, the part (301 in FIG. 3) of the gate electrode in the conventional LDD structure is referred to as the central part of the gate electrode in the sense that it is a part of the gate electrode but not all of the gate electrode. Also, the part (302 in FIG. 3) corresponding to the side wall of the conventional LDD structure is referred to as the side of the gate electrode as well as the side wall because it is a conductive part made of silicon-based material and constitutes a part of the gate electrode.

The example of the present invention is illustrated in FIG. 4. First, a field insulator (3000 Å to 1 μm thick) is formed on a silicon substrate 401 by the known technique of forming LOCOS. Then, a silicon oxide film 403 (100–500 Å thick) as the gate insulating film is formed by thermal oxidation. A polycrystalline silicon film (2000–5000 Å thick), with its conductivity increased by doping with phosphorus, is formed by the heated CVD technique. This film is etched so as to form the central part 404 of the gate electrode. Using the central part 404 of the gate electrode as a mask, phosphorus ions are implanted by the self-alignment technique so as to form the region 405, 406 with n-type impurity in low concentration (LDD). The desirable concentration of phosphorus in LDD 405, 406 is $1\times10^{16}$ to $1\times10^{17}$ atoms/cm$^3$, and the desirable depth is 300–1000 Å. (FIG. 4(A))

Then, a polycrystalline silicon film 407 (2000 Å–1 μm thick), with its conductivity increased by doping with phosphorus, is formed by the heated CVD technique. The crystallinity of the silicon film 407 plays an important role in determining the selectivity of etching by fluorinated halogen and hence in increasing the aspect ratio of (quasi-)anisotropic etching to be performed according to the present invention. Crystalline silicon has very good crystallinity if it is obtained from amorphous silicon by crystallization which is induced by the heat annealing of amorphous silicon incorporated with a trace amount of nickel or a similar element. The technique of promoting crystallization by the addition of nickel or the like is disclosed in Japanese Patent Laid-open Nos. 244103/1994, 244205/1994, 296020/1994, and 296023/1994, and others.

Subsequently, the wafer undergoes anisotropic etching with ClF$_3$ based on the principle illustrated in FIG. 2. This anisotropic etching consists of the following steps. (1) Implantation of silicon ions at a dose of $1\times10^{14}$ to $5\times10^{15}$ atoms/cm$^2$, with the accelerating voltage being 50–200 kV. As the result of this step, the polycrystalline silicon film 407 is made amorphous, except for the side of the central part of the gate electrode 404. (2) Introduction of nitrogen and ClF$_3$ into a quartz chamber in which the wafer is placed, with the flow rate of ClF$_3$ and nitrogen being 500 sccm each and the pressure in the chamber being 1–5 Torr.

As the result, the silicon film 407 is etched, except for the side of the central part 404 of the gate electrode which has not been made amorphous, and the side wall 409 of the gate electrode is formed on the side of the central part 404 of the gate electrode. (The broken line 408 indicates the original polycrystalline silicon film.) Under the conditions in this example, the etching rate for amorphous silicon is about twice that for polycrystalline silicon. This means that etching in this example is quasi-anisotropic etching; therefore, the side 409 of the gate electrode is slightly narrower than that which would be obtained by the complete anisotropic etching. (FIG. 4(C))

Using the central part 404 and the side 409 of the gate electrode as a mask, arsenic ion implantation is performed so as to form the source 410 and the drain 411. The concentration of arsenic is $1\times10^{19}$ to $1\times10^{20}$ atoms/cm$^3$. Recrystallization by heat annealing is performed on the LDD 405, 406 and the source/drain 410, 411. (FIG. 4(D))

A silicon oxide film 412 (3000 Å to 1 μm thick), as an interlayer insulator, is formed by the heated CVD technique. Contact holes are formed in this film, and the source electrode 413 and the drain electrode 414 are formed. In this way there is obtained a transistor of GOLD type. (FIG. 4(E))

As mentioned above, the present invention permits the etching of a silicon substrate and the etching of polycrystalline silicon interconnects. The etching according to the present invention does not give off carbon and sulfur and hence has no adverse effect on the characteristic properties of semiconductor elements. The absence of by-products permits the etching to be carried out for a long period of time without deposition on the inside wall of the chamber. This leads to easy maintenance of equipment.

In addition, the etching according to the present invention does not employ plasma and this contributes to the reliability of semiconductor elements. The absence of damage by plasma is advantageous to the semiconductor substrate, gate electrode, and interconnect. Although the present invention was described with reference to the example which illustrates the fabrication of a field-effect transistor of GOLD structure, the present invention can be effectively used in other applications. For example, it can be effectively applied to TFT formed on an insulating substrate. Thus, the present invention is of great industrial use.

What is claimed is:

1. A method for fabricating a semiconductor device comprising the steps of:

forming a crystalline silicon film on a substrate;

selectively forming an amorphous portion in said crystalline silicon film; and preferentially etching said amorphous portion;

wherein an etching rate of said amorphous portion is larger than that of said crystalline silicon film.

2. A method of claim 1 wherein the selective formation of said amorphous portion is performed by irradiating ions with a mask formed on said crystalline silicon film.

3. A method of claim 2 wherein said ions is selected from hydrogen ions, silicon ions, and rare gas ions.

4. A method of claim 1 wherein the preferential etching of said amorphous portion is performed in an atmosphere of fluorinated halogen.

5. A method of claim 4 wherein hydrogen ions is used as said irradiating ions, the concentration of said hydrogen ions being more than $1 \times 10^{21}$ atoms/cm$^3$.

6. A method of claim 4 wherein the etching rate is controlled according to concentration, temperature or flow rate of said fluorinated halogen.

7. A method claim 1 wherein said preferential etching of said amorphous portion is performed with etching of said crystalline silicon film surrounding said amorphous portion, whereby quasi-anisotropic etching is performed.

8. A method of claim 1 wherein said substrate is an insulating substrate and said semiconductor devise is a thin film transistor formed on said insulating substrate.

9. A method of claim 1 wherein said crystalline silicon film is formed by thermally annealing an amorphous silicon comprising at least one species selected from nickel, platinum, iron, cobalt, and palladium.

10. A method for fabricating a semiconductor device comprising the steps of:

forming a crystalline silicon interconnect on a substrate;

forming a crystalline silicon film on said crystalline silicon interconnect;

selectively forming an amorphous portion in said crystalline silicon film, thereby the amorphous portion and a crystalline silicon portion being formed in said crystalline silicon film, and preferentially etching said amorphous portion such that a side wall is formed at a side of said crystalline silicon interconnection, said side wall corresponding to said crystalline silicon portion.

11. A method of claim 10 wherein the selective formation of said amorphous portion is performed by irradiating ions, a depth of the ion penetration being controlled by the ion accelerating voltage.

12. A method of claim 11 wherein the ion penetration reaches to the upper part of said crystalline silicon interconnect.

13. A method of claim 10 wherein the preferential etching of said amorphous portion is performed in an atmosphere of fluorinated halogen.

14. A method of claim 10 wherein an approximately triangular wall of crystalline silicon is formed on each side of said crystalline silicon interconnect by said preferential etching.

15. A method of claim 10 wherein said substrate is an insulating substrate and said semiconductor devise is a thin film transistor formed on said insulating substrate.

16. A method of claim 10 wherein said crystalline film is formed by thermally annealing an amorphous silicon comprising at least one species selected from nickel, platinum, iron, cobalt, and palladium.

17. A method for fabricating a field-effect transistor comprising the steps of:

forming a gate insulating film on a substrate;

forming a central portion as a part of a gate electrode on said gate insulating film, said central portion comprising crystalline silicon;

forming a lightly doped region in said substrate using said central portion as a mask;

forming a crystalline silicon film on at least said central portion;

selectively forming an amorphous portion in said crystalline silicon film, thereby the amorphous portion and a crystalline silicon portion being formed in said crystalline silicon film; and preferentially etching said amorphous portion such that a side wall as a part of said gate electrode is formed at a side of said central portion and over said lightly doped region, said side wall corresponding to said crystalline silicon portion.

18. A method of claim 17 wherein the preferential etching of said amorphous portion is performed in an atmosphere of fluorinated halogen.

19. A method of claim 17 wherein said crystalline film is formed by thermally annealing an amorphous silicon comprising at least one species selected from nickel, platinum, iron, cobalt, and palladium.

20. A method of claim 17 further comprising the following step of:

performing ion implantation in order to source and drain regions using said central portion and said side wall as a mask.

* * * * *